United States Patent
Moriguchi et al.

(10) Patent No.: US 8,373,499 B2
(45) Date of Patent: Feb. 12, 2013

(54) SEMICONDUCTOR INTEGRATED CIRCUIT HAVING NORMAL MODE AND SELF-REFRESH MODE

(75) Inventors: Koji Moriguchi, Higashiosaka (JP); Toshio Takahashi, Ogaki (JP)

(73) Assignee: SANYO Electric Co., Ltd., Moriguchi-Shi (JP)

( * ) Notice: Subject to any disclaimer, the term of this patent is extended or adjusted under 35 U.S.C. 154(b) by 232 days.

(21) Appl. No.: 12/844,450

(22) Filed: Jul. 27, 2010

(65) Prior Publication Data

US 2011/0018620 A1    Jan. 27, 2011

(30) Foreign Application Priority Data

Jul. 27, 2009    (JP) .................. 2009-174433

(51) Int. Cl.
*G05F 3/02*    (2006.01)
(52) U.S. Cl. ........................ 327/537; 327/543
(58) Field of Classification Search .................. 327/537, 327/543
See application file for complete search history.

(56) References Cited

U.S. PATENT DOCUMENTS

| | | | |
|---|---|---|---|
| 4,683,382 A * | 7/1987 | Sakurai et al. ................ | 327/544 |
| 5,554,953 A | 9/1996 | Shibayama et al. | |
| 5,594,699 A | 1/1997 | Nomura et al. | |
| 5,867,438 A | 2/1999 | Nomura et al. | |
| 5,909,142 A * | 6/1999 | Kawasaki et al. .............. | 327/543 |
| 5,923,157 A * | 7/1999 | Edo ................ | 323/282 |
| 6,005,436 A | 12/1999 | Shibayama et al. | |
| 6,038,186 A | 3/2000 | Tanizaki | |
| 6,097,658 A | 8/2000 | Satoh et al. | |
| 6,236,194 B1 | 5/2001 | Manabe et al. | |
| 6,335,895 B1 | 1/2002 | Sugibayashi | |
| RE39,374 E | 11/2006 | Manabe et al. | |
| 7,319,361 B2 * | 1/2008 | Jin ................ | 327/543 |
| 2002/0027234 A1 | 3/2002 | Kato et al. | |
| 2005/0189931 A1 | 9/2005 | Ishino | |

(Continued)

FOREIGN PATENT DOCUMENTS

| | | |
|---|---|---|
| JP | 06208791 | 7/1994 |
| JP | 7-85658 A | 3/1995 |

(Continued)

OTHER PUBLICATIONS

Machine Translation and English Abstract for JP 11-149779 A, published Jun. 2, 1999.

(Continued)

*Primary Examiner* — Hai L Nguyen
(74) *Attorney, Agent, or Firm* — Novak Druce Connolly Bove + Quigg, LLP

(57) ABSTRACT

An SDRAM includes a DC-DC converter IC for generating a first internal power supply voltage from external power supply voltage, a regulator IC for generating a second internal power supply voltage lower than the first internal power supply voltage, from external power supply voltage, and a switching portion for supplying the first internal power supply voltage to an internal circuit in a normal operation mode and supplying the second internal power supply voltage to the internal circuit in a self-refresh mode. The switching unit allows the DC-DC converter IC and the regulator IC to operate simultaneously only for a prescribed overlapped period, at a time of operation mode switching. The DC-DC converter IC temporarily increases the first internal power supply voltage within the operating voltage range of the internal circuit in the overlapped period.

4 Claims, 3 Drawing Sheets

U.S. PATENT DOCUMENTS

2006/0255781 A1 11/2006 Itoh
2008/0284402 A1 11/2008 Ishino

FOREIGN PATENT DOCUMENTS

| JP | 11-86544 A | 3/1999 |
|---|---|---|
| JP | 11-149779 A | 6/1999 |
| JP | 11203861 | 7/1999 |
| JP | 2000149557 | 5/2000 |
| JP | 2000-339961 A | 12/2000 |
| JP | 2001-117650 A | 4/2001 |
| JP | 2002-93166 A | 3/2002 |
| JP | 2003-216247 A | 7/2003 |
| JP | 2005-190381 A | 7/2005 |
| JP | 2005-198484 A | 7/2005 |

OTHER PUBLICATIONS

Machine Translation and English Abstract for JP 2003-216247 A, published Jul. 31, 2003.
Machine Translation and English Abstract for JP 2001-117650 A, published Apr. 27, 2001.
Machine Translation and English Abstract for JP 2005-198484 A, published Jul. 21, 2005.
English Abstract for JP 11-86544 A, published Mar. 30, 1999.
English Abstract for JP 2005-190381 A, published Jul. 14, 2005.
English Abstract for JP 2002-93166 A, published Mar. 29, 2002.
English Abstract for JP 2000-339961 A, published Dec. 8, 2000.
English Abstract for JP 7-85658 A, published Mar. 31, 1995.

* cited by examiner

SEMICONDUCTOR INTEGRATED CIRCUIT HAVING NORMAL MODE AND SELF-REFRESH MODE

This nonprovisional application is based on Japanese Patent Application No. 2009-174433 filed on Jul. 27, 2009 with the Japan Patent Office, the entire contents of which are hereby incorporated by reference.

BACKGROUND OF THE INVENTION

1. Field of the Invention

The present invention relates to a semiconductor integrated circuit, and more particularly to a semiconductor integrated circuit having a normal operation mode and a self-refresh mode.

2. Description of the Related Art

In order to reduce power consumption of semiconductor integrated circuits and ensure reliability of internal circuits thereof, semiconductor integrated circuits having internal step-down circuits have been put to practical use. As such a semiconductor integrated circuit, for example, a DRAM (Dynamic Random Access Memory) is disclosed which is configured to include an internal step-down circuit generating first and second internal stepped-down voltages different from each other, and an internal element being driven with the higher voltage of the first and second internal stepped-down voltages generated by the internal step-down circuit in a normal operation mode and being driven with the lower voltage of the first and second internal stepped-down voltages generated by the internal step-down circuit in a self-refresh mode.

In the above-mentioned semiconductor integrated circuit, power consumption of the semiconductor integrated circuit in the self-refresh mode is reduced by reducing supply voltage to the internal element in the self-refresh mode as compared with in the normal operation mode.

On the other hand, however, the internal step-down circuit is used in common in the normal operation mode and in the self-refresh mode, so that power loss of the internal step-down circuit in the self-refresh mode is greater than power consumption in the semiconductor integrated circuit, thereby reducing the power conversion efficiency.

Furthermore, the internal step-down circuit is configured to select one of the first and second internal stepped-down voltages and output the selected voltage as internal stepped-down voltage by controlling a switching operation of an MOS transistor included in a first output circuit for outputting the first internal stepped-down voltage and a switching operation of an MOS transistor included in a second output circuit for outputting the second internal stepped-down voltage. Therefore, when the operation mode of the DRAM is switched, voltage variations of the internal stepped-down voltage are caused by switching on/off of the MOS transistors.

SUMMARY OF THE INVENTION

An object of the present invention is to provide a semiconductor integrated circuit capable of supplying internal power supply voltage to an internal circuit with high efficiency and stability, in a simple configuration.

In accordance with an aspect of the present invention, a semiconductor integrated circuit having a normal operation mode and a self-refresh mode includes: a first internal step-down circuit which generates a first internal power supply voltage from a supplied external power supply voltage; a second internal step-down circuit which generates a second internal power supply voltage lower than the first internal power supply voltage, from the supplied external power supply voltage; and a switching unit which supplies the first internal power supply voltage output from the first internal step-down circuit to an internal circuit in the normal operation mode and supplies the second internal power supply voltage output from the second internal step-down circuit to the internal circuit in the self-refresh mode. At a time of operation mode switching from the normal operation mode to the self-refresh mode, the switching unit activates the second internal step-down circuit at a timing earlier than a switching timing of operation mode and stops the first internal step-down circuit at the switching timing. At the time of operation mode switching from the self-refresh mode to the normal operation mode, the switching portion activates the first internal step-down circuit at a switching timing of operation mode and stops the second internal step-down circuit at a timing later than the switching timing.

Preferably, the internal circuit has a prescribed operating voltage range. At the time of operation mode switching from the normal operation mode to the self-refresh mode, the first internal step-down circuit temporarily increases the first internal power supply voltage within the prescribed operating voltage range, in a period from a timing earlier than the timing of activating the second internal step-down circuit to the switching timing of operation mode. At the time of operation mode switching from the self-refresh mode to the normal operation mode, the first internal step-down circuit temporarily increases the first internal power supply voltage within the prescribed voltage range, in a period from the switching timing of operation mode to a timing later than the timing of stopping the second internal step-down circuit.

In accordance with another aspect of the present invention, a semiconductor integrated circuit having a normal operation mode and a self-refresh mode includes: a first internal step-down circuit which generates a first internal power supply voltage from a supplied external power supply voltage; a second internal step-down circuit which generates a second internal power supply voltage lower than the first internal power supply voltage, from the supplied external power supply voltage; and a switching unit which supplies the first internal power supply voltage output from the first internal step-down circuit to an internal circuit in the normal operation mode and supplies the second internal power supply voltage output from the second internal step-down circuit to the internal circuit in the self-refresh mode. The first internal step-down circuit is a DC-DC converter which converts external power supply voltage to generate the first internal power supply voltage by controlling switching of a first transistor and a second transistor. The second internal step-down circuit is a series regulator which converts external power supply voltage to generate the second internal power supply voltage by controlling base current of a third transistor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
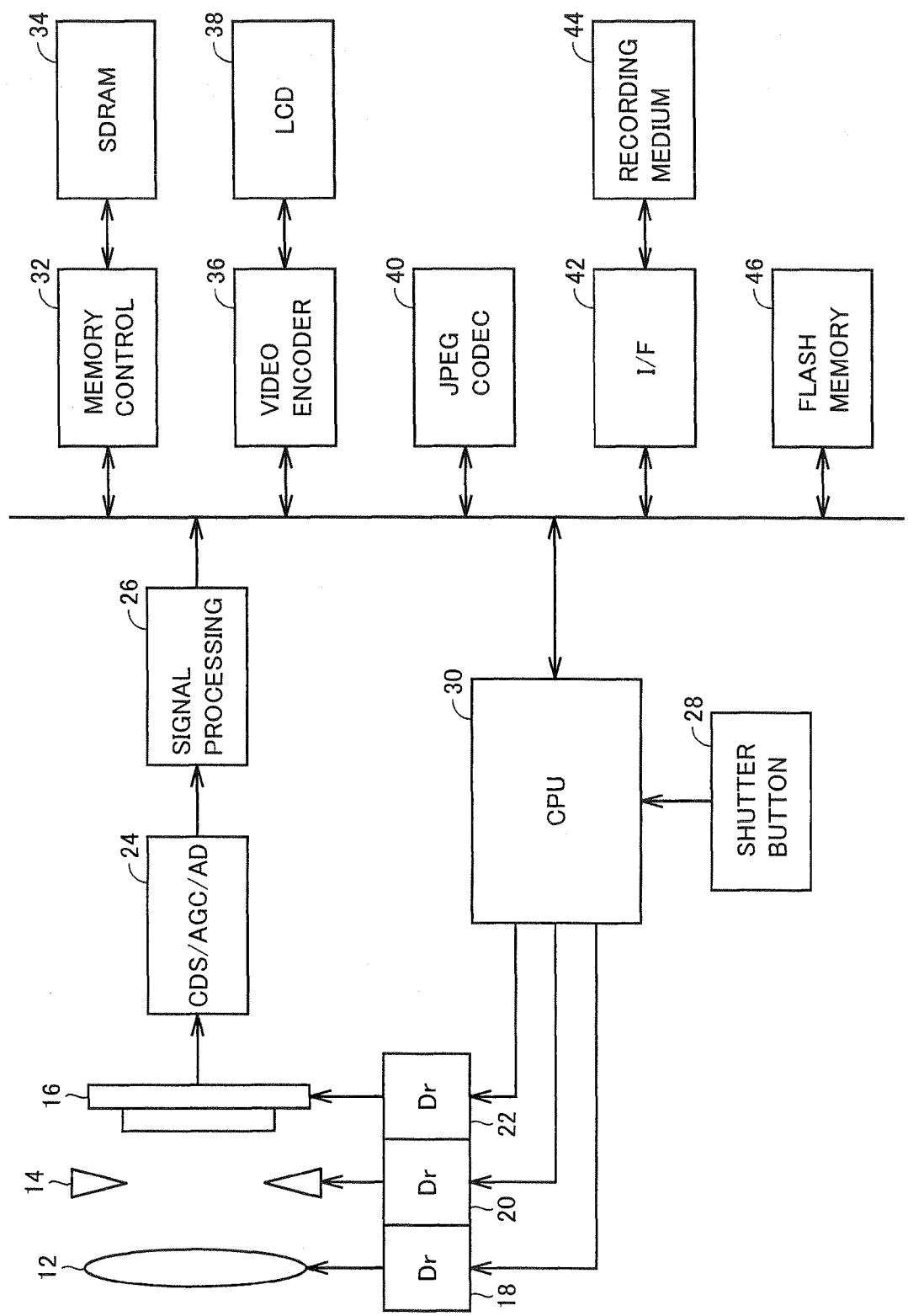
FIG. 1 is a schematic structural diagram showing a main part of a digital camera including a semiconductor integrated circuit in accordance with an embodiment of the present invention.

In the following, an embodiment of the present invention will be described in detail with reference to the figures. It is noted that the same or corresponding parts in the figures are denoted with the same reference numerals and a description thereof will not be repeated.

FIG. 1 is a schematic structural diagram showing a main part of a digital camera 10 including a semiconductor integrated circuit in accordance with an embodiment of the present invention.

In the present embodiment, a semiconductor integrated circuit mounted on digital camera 10 is illustrated as an example of the semiconductor integrated circuit. The semiconductor integrated circuit is formed, for example, of an SDRAM (Synchronous Dynamic Random Access Memory) having a normal operation mode and a self-refresh mode.

Referring to FIG. 1, in digital camera 10, an optical image in the field is applied to a light-receiving surface, that is, an imaging surface of an image sensor 16 through a focus lens 12 and a diaphragm unit 14. In the imaging surface, a raw image signal which is an electrical charge corresponding to the optical image in the field is generated by photoelectric conversion.

When a through image processing is executed in which real-time moving images in the field are displayed on an LCD (Liquid Crystal Display) monitor 38, a CPU (Central Processing Unit) 30 instructs a driver 20 to open the diaphragm and instructs a driver 22 to repeat pre-exposure and thinning-out reading. Driver 20 opens the aperture of diaphragm unit 14, and driver 22 repeatedly executes pre-exposure of image sensor 16 and thinning-out reading of the thus generated raw image signal. Accordingly, a low-resolution raw image signal corresponding to the optical image in the field is output from image sensor 16 at a frame rate of 30 fps.

The output raw image signal in each frame is subjected to a series of processes such as noise elimination, level adjustment, and A/D conversion by a CDS (Correlated Double Sampling)/AGC (Auto Gain Controller)/AD (Analog to Digital) circuit 24, so that raw image data, which is a digital signal, is obtained. A signal processing circuit 26 performs processing such as white balance adjustment, color separation, and YUV conversion on the raw image data output from CDS/AGC/AD circuit 24 to generate image data in the YUV format. The generated image data is written in an SDRAM 34 by a memory control circuit 32 and is later read out by memory control circuit 32.

A video encoder 36 converts the image data read out by memory control circuit 32 into a composite video signal in accordance with the NTSC format and provides the converted composite video signal to LCD monitor 38. As a result, the through image in the field is displayed on the monitor screen.

When a shutter button 28 is pressed down halfway, CPU 30 performs an AE (Auto Exposure) process and an AF (Auto Focus) process. CPU 30 adjusts the pre-exposure time set in driver 22 and the aperture of diaphragm unit 14 based on a luminance evaluation value obtained by the AF process. Furthermore, CPU 30 drives a driver 18 based on an AF evaluation value (focusing degree) obtained by the AF process and a high luminance count value. Accordingly, focus lens 12 is set at the focal point.

When shutter button 28 is pressed all the way down, an image recording process is executed by CPU 30. CPU 30 first instructs driver 22 to perform primary exposure and all-pixel reading. Driver 22 then executes primary exposure of image sensor 16 and all-pixel reading of the thus generated raw image signal, once for each. Accordingly, a high-resolution raw image signal corresponding to the optical image in the field is output from image sensor 16 at a frame rate of 30 fps. The output raw image signal is converted into image data in the YUV format through the similar process as above, and the converted image data is written into SDRAM 34 by memory control circuit 32.

CPU 30 also issues an image compression instruction to a JPEG codec 40. JPEG codec 40 reads out image data of one frame from SDRAM 34 through memory control circuit 32, performs JPEG compression on the read image data, and then writes the compressed image data, that is, JPEG data into SDRAM 34 through memory control circuit 32.

In addition, CPU 30 sequentially reads out the JPEG data from SDRAM 34 through memory control circuit 32 and records an image file including the read JPEG data into a recording medium 44 through an I/F circuit 42. Upon completion of such an image recording process, the above-noted through image processing is resumed. It is noted that the control program corresponding to those processes is stored in a flash memory 46.

In the configuration shown in FIG. 1, access to SDRAM 34 is controlled by memory control circuit 32 in the normal operation mode. Memory control circuit 32 receives an instruction issued from CPU 30 and interprets the instruction to control access to SDRAM 34.

When SDRAM 34 is shifted from the normal operation mode to the self-refresh mode, in response to an instruction from CPU 30, memory control circuit 32 issues a command to SDRAM 34 to shift SDRAM 34 to the self-refresh mode.

In the self-refresh mode, without a signal applied from the outside to SDRAM 34 for refresh, SDRAM 34 performs a refresh operation internally. SDRAM 34 has an internal step-down circuit for generating internal power supply voltage having a certain magnitude from the supplied external power supply voltage and for supplying the generated internal power supply voltage to an internal circuit, in each of the normal operation mode and the self-refresh mode.

Figure 2:
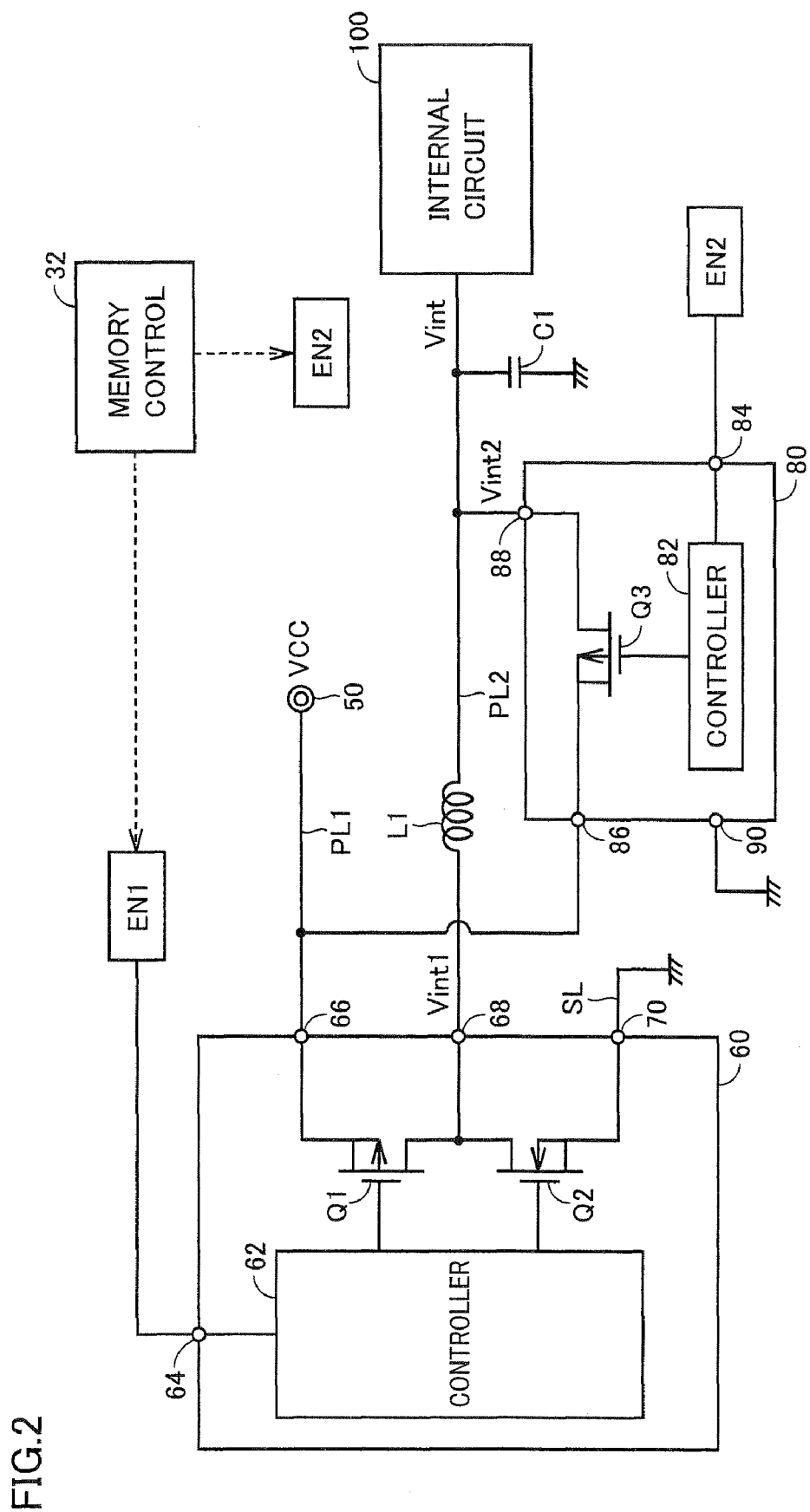
FIG. 2 is a diagram illustrating a configuration of an SDRAM in FIG. 1.

FIG. 2 is a diagram illustrating the configuration of SDRAM 34 in FIG. 1.

Referring to FIG. 2, SDRAM 34 includes an external power supply voltage input terminal 50 for receiving external power supply voltage VCC, a DC-DC converter IC 60, a regulator IC 80, an inductor L1, a capacitor C1, and an internal circuit 100.

DC-DC converter IC 60 is connected to external power supply voltage input terminal 50 to perform a voltage conversion operation between external power supply voltage input terminal 50 and internal circuit 100. In other words, DC-DC converter IC 60 decreases external power supply voltage VCC to generate an internal power supply voltage Vint1.

Specifically, DC-DC converter IC 60 includes transistors Q1, Q2 serving as switching elements, a controller 62, a control terminal 64, a voltage input terminal 66, a voltage output terminal 68, and a ground terminal 70.

Transistor Q1 and transistor Q2 are connected in series between a power supply line PL1 and a ground line SL. Transistor Q1 is formed of a P-channel MOS transistor and has its source connected to power supply line PL1. Transistor Q2 is formed of an N-channel MOS transistor and has its source connected to ground line SL. Inductor L1 is connected to a connection point (a voltage output terminal 68) between transistor Q1 and transistor Q2.

A series circuit of inductor L1 and capacitor C1 forms a smoothing circuit, and a connection point between inductor L1 and capacitor C1 are connected to a power supply line PL2. Inductor L1 has one end connected to voltage output terminal 68, and capacitor C1 has the other end connected to the ground. In this smoothing circuit, the voltage at voltage output terminal 68 is smoothed by inductor L1, so that direct-current internal power supply voltage Vint1 at a desired magnitude can be obtained.

Controller 62 controls a voltage conversion operation of DC-DC converter IC 60 in accordance with a command EN1 input from memory control circuit 32 (FIG. 1) to a control terminal 64.

Command EN1 is a command issued by memory control circuit 32 in response to an instruction from CPU 30. Specifically, when, in response to power-on or the like, CPU 30 issues a starting instruction to memory control circuit 32 to switch the operation mode of SDRAM 34 to the normal operation mode, memory control circuit 32 generates command EN1 at an H (logic high) level for output to DC-DC converter IC 60.

On the other hand, when, in response to power cut-off or the like, CPU 30 issues a stop instruction to memory control circuit 32 to switch the operation mode of SDRAM 34 to the self-refresh mode, memory control circuit 32 generates command EN1 at an L (logic low) level for output to DC-DC converter IC 60.

When command EN1 changes from the L level to the H level, that is, when the operation mode is switched from the self-refresh mode to the normal operation mode, controller 62 starts a voltage conversion operation. At this point, controller 62 allows transistors Q1, Q2 to turn on/off in a complementary manner at a prescribed duty ratio. Controller 62 can maintain the voltage output to voltage output terminal 68 at a target value of the operating voltage of internal circuit 100 by PWM (Pulse Width Modulation) control in which the above-noted duty ratio is adjusted. As a result, the voltage decreased in accordance with the duty ratio through the switching operation of transistors Q1, Q2 is output as internal power supply voltage Vint1 from voltage output terminal 68 through inductor L1 to power supply line PL2.

On the other hand, when command EN1 changes from the H level to the L level, that is, when the operation mode is switched from the normal operation mode to the self-refresh mode, controller 62 stops the voltage conversion operation. At this point, controller 62 keeps both transistors Q1 and Q2 in an off state, so that internal power supply voltage Vint1 is not output from voltage output terminal 68.

Regulator IC 80 is connected to external power supply voltage input terminal 50 in parallel with the above-noted DC-DC converter IC 60. Regulator IC 80 performs a voltage conversion operation between external power supply voltage input terminal 50 and internal circuit 100. Specifically, regulator IC 80 decreases external power supply voltage VCC to generate an internal power supply voltage Vint2.

Specifically, regulator IC 80 is formed of a series regulator and includes a transistor Q3 for output control, a controller 82, a control terminal 84, a voltage input terminal 86, a voltage output terminal 88, and a ground terminal 90.

Transistor Q3 is formed of a P-channel MOS transistor and has its source connected to power supply line PL1 and its drain connected to power supply line PL2.

Controller 82 controls the voltage conversion operation of regulator IC 80 in accordance with a command EN2 input from memory control circuit 32 (FIG. 1) to control terminal 84.

It is noted that command EN2 is a command issued by memory control circuit 32 in response to an instruction from CPU 30. Specifically, when, in response to power cut-off or the like, CPU 30 issues a stop instruction to memory control circuit 32 to switch the operation mode of SDRAM 34 to the self-refresh mode, memory control circuit 32 generates command EN2 at the H level for output to regulator IC 80.

On the other hand, when, in response to power-on or the like, CPU 30 issues a starting instruction to memory control circuit 32 to switch the operation mode of SDRAM 34 to the normal operation mode, memory control circuit 32 generates command EN2 at the L level for output to regulator IC 80.

When command EN2 changes from the L level to the H level, that is, when the operation mode switches from the normal operation mode to the self-refresh mode, controller 82 starts a voltage conversion operation. At this point, controller 82 monitors the source voltage of transistor Q3 (that is, output voltage of regulator IC 80) and successively controls gate current of transistor Q3 such that the voltage attains a target value of the operating voltage of internal circuit 100. Then, the output voltage of regulator IC 80 is output as internal power supply voltage Vint2 from voltage output terminal 88 to power supply line PL2.

On the other hand, when command EN2 changes from the H level to the L level, that is, when the operation mode switches from the self-refresh mode to the normal operation mode, controller 82 stops the voltage conversion operation. At this point, controller 82 keeps transistor Q3 in an off state, so that internal power supply voltage Vint2 is not output from voltage output terminal 88.

As described above, the voltage conversion operations in DC-DC converter IC 60 and regulator IC 80 are controlled in accordance with commands EN1, EN2, respectively, from memory control circuit 32. Therefore, in the normal operation mode, internal power supply voltage Vint1 output from DC-DC converter IC 60 is supplied to internal circuit 100 through power supply line PL2, whereas in the self-refresh mode, internal power supply voltage Vint2 output from regulator IC 80 is supplied to internal circuit 100 through power supply line PL2. In other words, internal power supply voltages Vint1 and Vint2 are switched depending on the operation mode so that internal power supply voltage Vint is supplied to internal circuit 100.

In this way, the semiconductor integrated circuit in accordance with the present embodiment is configured to switch between DC-DC converter IC 60 and regulator IC 80 depending on the operation mode to generate internal power supply voltage Vint to be supplied to internal circuit 100, thereby increasing power conversion efficiency as a whole.

More specifically, although DC-DC converter IC 60 allows transistors Q1, Q2 to turn on/off at a high switching frequency and therefore has large consumption current, it has high power conversion efficiency and is thus effective in the normal operation mode in which power consumption is relatively large. However, in the mode in which power saving is requested such as in the self-refresh mode, power loss at DC-DC converter IC 60 is larger as compared with power consumption, because of the magnitude of consumption current, so that the power conversion efficiency is reduced.

On the other hand, regulator IC 80 has the characteristics of small consumption current and low power conversion efficiency.

The semiconductor integrated circuit in accordance with the present embodiment uses DC-DC converter IC 60 with high power conversion efficiency in the normal operation mode and uses regulator IC 80, taking the advantage of small consumption current, in the self-refresh mode in which consumption current is relatively small and the low power conversion efficiency is not a problem. As a result, the power conversion efficiency can be improved as a whole.

The operation of SDRAM 34 shown in FIG. 2 will now be described with reference to the timing chart in FIG. 3.

Figure 3:
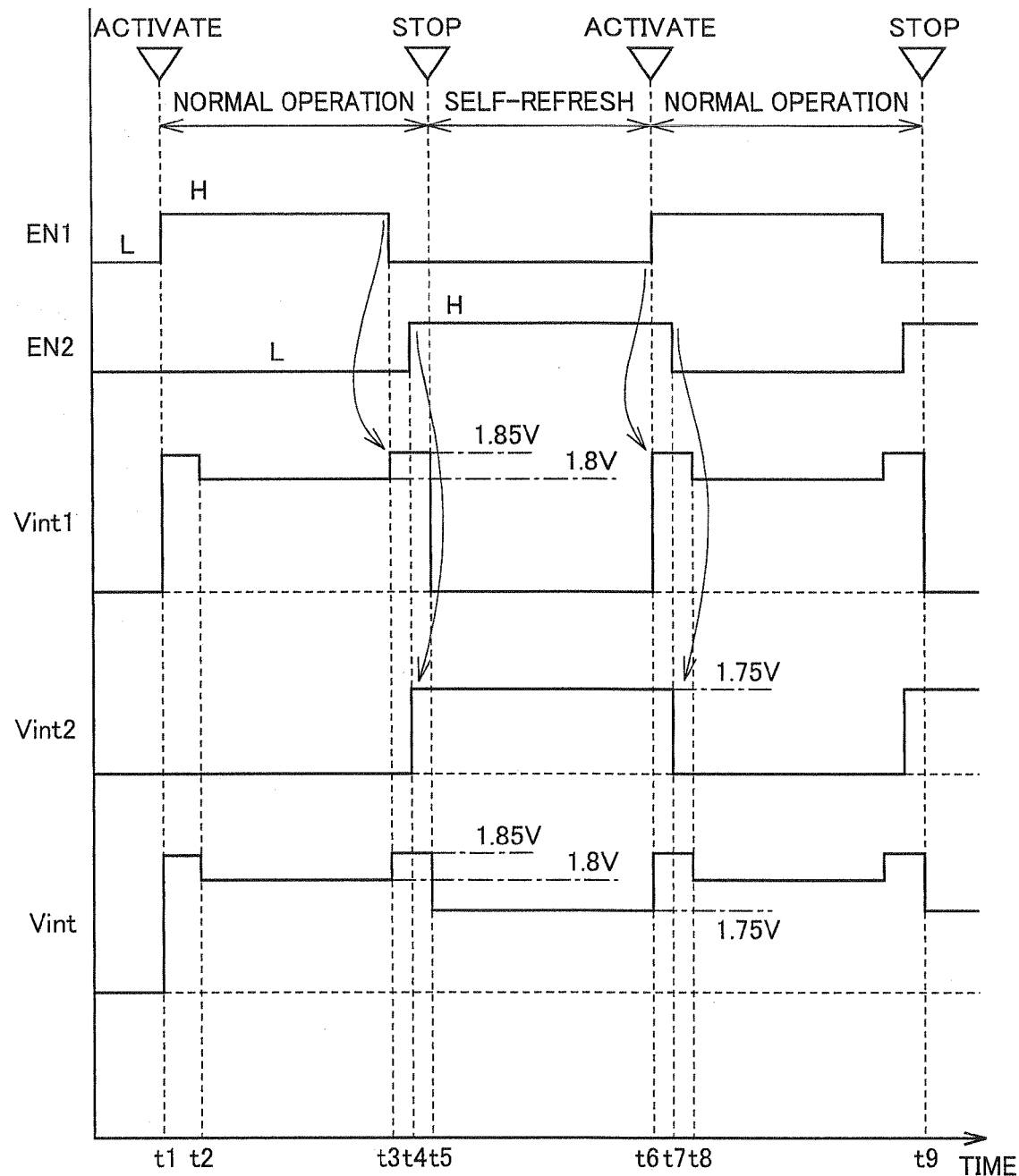
FIG. 3 is a timing chart illustrating an operation of the SDRAM shown in FIG. 2.

Referring to FIG. 3, at time t1, in response to power-on or the like, CPU 30 (FIG. 1) issues a starting instruction to memory control circuit 32 (FIG. 1) to switch the operation mode of SDRAM 34 to the normal operation mode, and memory control circuit 32 in turn generates command EN1 at the H level for output to DC-DC converter IC 60. Therefore, DC-DC converter IC 60 decreases external power supply voltage VCC to generate internal power supply voltage Vint1.

Memory control circuit 32 further generates command EN2 at the L level for output to regulator IC 80. Regulator IC 80 stops the voltage conversion operation (that is, turns off transistor Q3) in response to command EN2 at the L level.

At this point, in regulator IC 80, external power supply voltage VCC is applied to voltage input terminal 86 while internal power supply voltage Vint1 is applied to voltage output terminal 88. However, since the applied voltages at those terminals have the relation VCC>Vint1, reverse current is not generated inside regulator IC 80. As a result, even when voltage is applied to regulator IC 80, internal power supply voltage can be supplied to internal circuit 100 without any inconvenience.

Then, at time t3, in response to power cut-off or the like, CPU 30 (FIG. 1) issues a stop instruction to memory control circuit 32 to switch the operation mode of SDRAM 34 to the self-refresh mode, and memory control circuit 32 in turn generates command EN1 at the L level for output to DC-DC converter IC 60. Then, at time t4 later than time t3, memory control circuit 32 generates command EN2 at the H level for output to regulator IC 80.

DC-DC converter IC 60 receives command EN1 at the L level at time t3 and then temporarily increases internal power supply voltage Vint1 in the period from time t3 to time t5 at which the system of digital camera 10 is shut down. Assuming that internal power supply voltage Vint1 in the normal operation mode is, for example, 1.8 V, internal power supply voltage Vint1 increases from 1.8 V to 1.85 V in this period. It is noted that the increased internal power supply voltage Vint1 (1.85 V) is set so as not exceed the upper limit value (for example, 1.9 V) of the operating voltage range of internal circuit 100. Then, when the system of digital camera 10 is shut down at time t5, DC-DC converter IC 60 stops the voltage conversion operation (that is, turns off transistors Q1, Q2).

On the other hand, regulator IC 80 receives command EN2 at the H level at time t4 and then decreases external power supply voltage VCC to generate internal power supply voltage Vint2. This internal power supply voltage Vint2 is set to be lower than internal power supply voltage Vint1. For example, in FIG. 3, internal power supply voltage Vint2 is set at 1.75 V. In this manner, in the self-refresh mode, the internal power supply voltage lower than in the normal operation mode is generated thereby reducing power consumption in the self-refresh mode.

Here, as shown in FIG. 3, when the normal operation mode shifts to the self-refresh mode, regulator IC 80 is activated at time t4 earlier than time t5 at which DC-DC converter 60 is stopped. Therefore, in the period from time t4 to time t5, DC-DC converter IC 60 and regulator IC 80 simultaneously execute the voltage conversion operation. In this manner, when the operation mode is switched, the two ICs are simultaneously operated in a prescribed overlapped period, thereby preventing voltage variations in internal power supply voltage Vint at the time of switching of the operation mode. As a result, switching of internal power supply voltage Vint can be performed smoothly, enabling the internal circuit to operate stably.

It is noted that, also in the above-noted prescribed overlapped period, the applied voltages at input voltage terminal 86 and voltage output terminal 88 have the relation VCC>Vint2 in regulator IC 80. Therefore, reverse current is not generated inside regulator IC 80.

Furthermore, in the prescribed overlapped period, in DC-DC converter IC 60, the relation Vint1>Vint2 is established between the voltage output to voltage output terminal 68 (internal power supply voltage Vint1) and the voltage applied from voltage output terminal 88 to power supply line PL2 (internal power supply voltage Vint2). Therefore, reverse current is not generated either in DC-DC converter IC 60.

Then, at time t6, in response to power-on or the like, CPU 30 again issues a starting instruction to switch the operation mode of SDRAM 34 to the normal operation mode, and memory control circuit 32 in turn generates command EN1 at the H level for output to DC-DC converter IC 60. Memory control circuit 32 further generates command EN2 at the L level for output to regulator IC 80, at time t7 later than time t6.

DC-DC converter IC 60 receives command EN1 at the H level at time t6 and then decreases external power supply voltage VCC to generate internal power supply voltage Vint1. At this point, DC-DC converter IC 60 temporarily increases internal power supply voltage Vint1 in the period from time t6 to time t8. For example, internal power supply voltage Vint1 increases from 1.8 V to 1.85 V in this period. On the other hand, regulator IC 80 receives command EN2 at the L level at time t7 and then stops the voltage conversion operation (turns off transistor Q3) in response to this command EN2.

More specifically, when the self-refresh mode shifts to the normal operation mode, regulator IC 80 is stopped at time t7 later than time t6 at which DC-DC converter IC 80 is activated, so that DC-DC converter IC 60 and regulator IC 80 simultaneously execute the voltage conversion operation in the period from time t6 to time t7. Accordingly, it is possible to prevent voltage variations in internal power supply voltage Vint at the time of switching of the operation mode. Therefore, switching of internal power supply voltage Vint can be performed smoothly, enabling the internal circuit to operate stably.

In the present embodiment, SDRAM 34 corresponds to the "semiconductor integrated circuit," DC-DC converter IC 60 corresponds to the "first internal step-down circuit," and regulator IC 80 corresponds to the "second internal step-down circuit."

As described above, the semiconductor integrated circuit in accordance with the embodiment of the present invention is configured to allow the DC-DC converter IC with high power conversion efficiency to generate internal power supply voltage in the normal operation mode in which power consumption is relatively large, and to allow the regulator IC with small consumption current to generate internal power supply voltage in the self-refresh mode in which power consumption is relatively small. Accordingly, the power conversion efficiency can be improved as a whole while voltage is stably supplied to the internal circuit.

In addition, the DC-DC converter IC and the regulator IC are simultaneously operated only for a prescribed overlapped period when the operation mode is switched, thereby preventing voltage variations in the internal power supply voltage at the time of switching of the operation mode. As a result, switching of the internal power supply voltage can be performed smoothly.

Furthermore, the internal power supply voltage generated by the DC-DC converter IC is temporarily increased within the operating voltage range of the internal circuit in the above-noted prescribed overlapped period, thereby preventing reverse current in the inside of the DC-DC converter IC.

Although in the foregoing embodiment SDRAM mounted on a digital camera has been described as an example of the semiconductor integrated circuit, the present invention is applicable to general semiconductor integrated circuits having the normal operation mode and the self-refresh mode.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor integrated circuit having a normal operation mode and a self-refresh mode, comprising:
    a first internal step-down circuit which generates a first internal power supply voltage from a supplied external power supply voltage;
    a second internal step-down circuit which generates a second internal power supply voltage lower than said first internal power supply voltage, from the supplied external power supply voltage; and
    a switching unit which supplies said first internal power supply voltage output from said first internal step-down circuit to an internal circuit in said normal operation mode and supplies said second internal power supply voltage output from said second internal step-down circuit to said internal circuit in said self-refresh mode, wherein
    at a time of operation mode switching from said normal operation mode to said self-refresh mode, said switching unit activates said second internal step-down circuit at a timing earlier than a switching timing of operation mode and stops said first internal step-down circuit at said switching timing, and
    at a time of operation mode switching from said self-refresh mode to said normal operation mode, said switching unit activates said first internal step-down circuit at a switching timing of operation mode and stops said second internal step-down circuit at a timing later than said switching timing.

2. The semiconductor integrated circuit according to claim 1, wherein
    said internal circuit has a prescribed operating voltage range,
    at the time of operation mode switching from said normal operation mode to said self-refresh mode, said first internal step-down circuit temporarily increases said first internal power supply voltage within said prescribed operating voltage range, in a period from a timing earlier than the timing of activating said second internal step-down circuit to the switching timing of operation mode, and
    at the time of operation mode switching from said self-refresh mode to said normal operation mode, said first internal step-down circuit temporarily increases said first internal power supply voltage within said prescribed voltage range, in a period from the switching timing of operation mode to a timing later than the timing of stopping said second internal step-down circuit.

3. A semiconductor integrated circuit having a normal operation mode and a self-refresh mode, comprising:
    a first internal step-down circuit which generates a first internal power supply voltage from a supplied external power supply voltage;
    a second internal step-down circuit which generates a second internal power supply voltage lower than said first internal power supply voltage, from the supplied external power supply voltage; and
    a switching unit which supplies said first internal power supply voltage output from said first internal step-down circuit to an internal circuit in said normal operation mode and supplies said second internal power supply voltage output from said second internal step-down circuit to said internal circuit in said self-refresh mode, wherein
    said first internal step-down circuit is a DC-DC converter which converts the external power supply voltage to generate said first internal power supply voltage by controlling switching of a first transistor and a second transistor, and
    said second internal step-down circuit is a series regulator which converts the external power supply voltage to generate said second internal power supply voltage by controlling base current of a third transistor.

4. The semiconductor integrated circuit according to claim 3, wherein the first internal step-down circuit and the second internal step-down circuit are capable of simultaneously operating in a prescribed overlapped period.

* * * * *